United States Patent [19]

Waldrop et al.

[11] 4,427,840
[45] Jan. 24, 1984

[54] PLASTIC SCHOTTKY BARRIER SOLAR CELLS

[75] Inventors: James R. Waldrop; Marshall J. Cohen, both of Thousand Oaks, Calif.

[73] Assignee: The United States of America as represented by the United States Department of Energy, Washington, D.C.

[21] Appl. No.: 335,994

[22] Filed: Dec. 30, 1981

[51] Int. Cl.$^3$ ............................................. H01L 31/06
[52] U.S. Cl. .................................... 136/255; 136/263; 357/8; 357/15; 357/30
[58] Field of Search .................... 136/255, 263; 357/8, 357/15, 30

[56] References Cited

U.S. PATENT DOCUMENTS

| | | | |
|---|---|---|---|
| 3,057,947 | 10/1962 | Calvin et al. | 136/263 |
| 3,676,688 | 7/1972 | Sharples et al. | 250/211 R |
| 3,781,549 | 12/1973 | Fletcher et al. | 250/211 J |
| 3,844,843 | 10/1974 | Kay et al. | 136/206 |
| 3,935,031 | 1/1976 | Adler | 136/264 |
| 4,125,414 | 11/1978 | Tang et al. | 136/263 |
| 4,127,738 | 11/1978 | Ghosh et al. | 136/255 |
| 4,164,431 | 8/1979 | Tang | 136/263 |
| 4,204,216 | 5/1980 | Heeger et al. | 357/8 |
| 4,214,916 | 7/1980 | Felsher et al. | 136/255 |

OTHER PUBLICATIONS

J. R. Waldrop et al, "The Mechanism of Schottley-Barrier Formation In Polyacetylene", *Appl. Phys. Lett.*, vol. 38, pp. 53–55 (1981).
P. M. Grant et al., "Properties of Metal/Polyacetylene Schottkey Barriers", *J. Appl. Phys.*, vol. 52, pp. 869–872 (Feb. 1981).
T. Tani et al., "Phototransport Effects In Polyacetylene, $(CH)_x$", *Solid State Communications*, vol. 33, pp. 499–503 (Feb. 1980).
*Chem. Abstracts*, vol. 93, 35720g (1980).
M. Ozaki et al., "Semiconductor Properties of Polyacetylene $p(CH)_x$; n–CdS Heterojunctions", *J. Appl. Phys.*, vol. 51, pp. 4252–4256 (Aug. 1980).
J. Kanicki et al, "Photovoltaic & Rectification Properties of In/trans-$(CH)_x$ Electrodag+502 Schottky-Barrier Cells", *Mol. Cryst.Liq.Cryst.*, vol. 83, pp. 319–327 (1982).
H. Kiess et al, "Investigation On The Doping Of Polyacetylene Films", *J. Electronic Mat'ls.*, vol. 9, pp. 763–781 (1980).
*Chemical & Engineering News*, Apr. 24, 1978, pp. 19–20.
*Chemical & Engineering News*, Aug. 27, 1979, p. 8.

*Primary Examiner*—Aaron Weisstuch
*Attorney, Agent, or Firm*—Jeannette M. Walder; Walter L. Rees; Richard G. Besha

[57] ABSTRACT

A photovoltaic cell structure is fabricated from an active medium including an undoped, intrinsically p-type organic semiconductor comprising polyacetylene. When a film of such material is in rectifying contact with a magnesium electrode, a Schottky-barrier junction is obtained within the body of the cell structure. Also, a gold overlayer passivates the magnesium layer on the undoped polyacetylene film.

6 Claims, 6 Drawing Figures

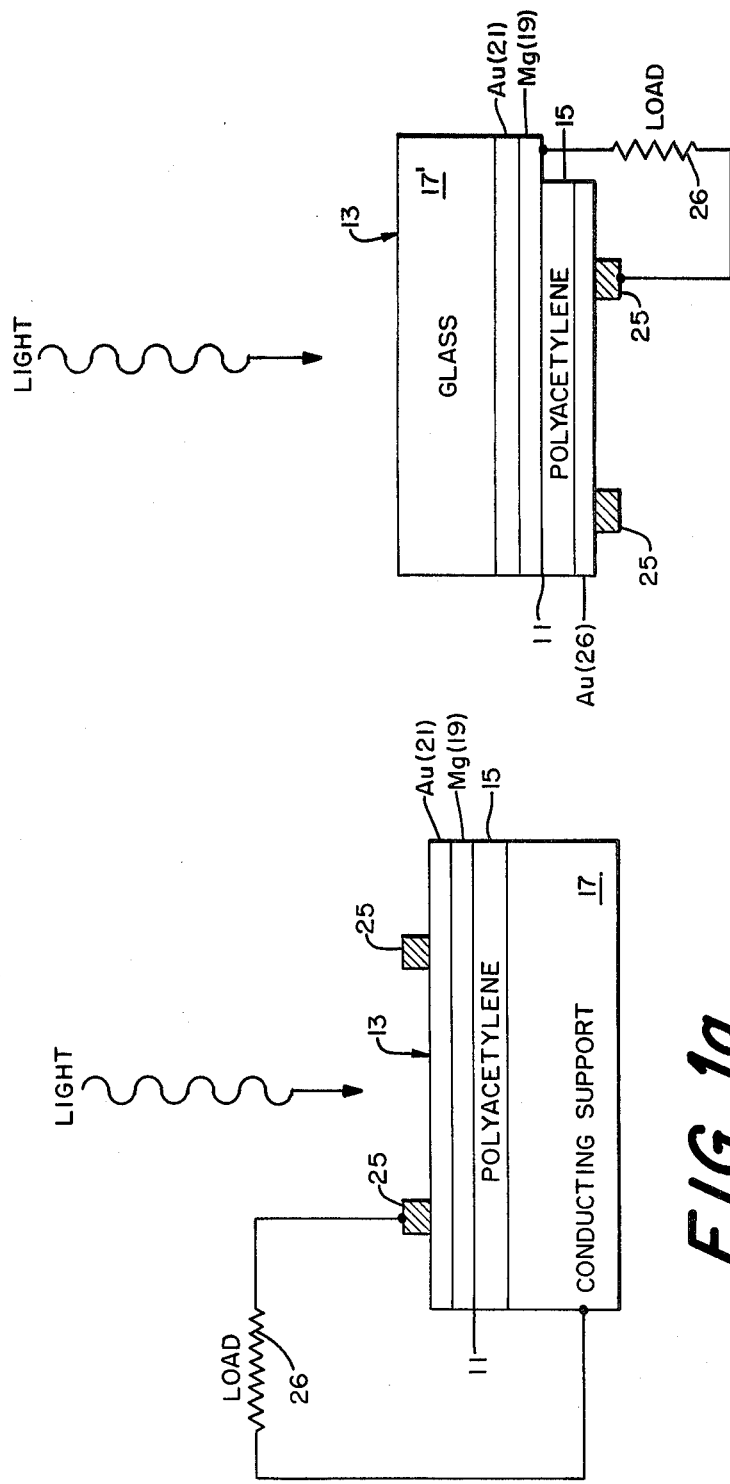

PLASTIC SCHOTTKY BARRIER SOLAR CELLS

BACKGROUND OF THE INVENTION

The U.S. Government has rights in this invention under Department of Energy Contract DE-AC04-79ET-23002 with the U. of Pennsylvania and Subcontract 5-25508-0 with Rockwell International.

Organic semiconductors constitute a class of materials that has been extensively investigated as a possible substitute for the conventional crystalline seniconductor materials. In particular, since the photosensitivity of organic semiconductors is well known, many attempts have been made to produce them for photoelectric devices that could be used to replace the expensive single crystal devices now being used. The single crystal semiconductor solar cells now in use are quite expensive, but their use persists because the best organic semiconductor solar cells have efficiencies many orders of magnitude too low. Even if the organic semiconductor solar cell were to have an inferior electrical efficiency, its lower cost would make it competitive, provided that the efficiency differential is not too great. In the solar cell application, reduced efficiency results in a collection area penalty. Where collection area is a primary factor, such as in spacecraft applications, a more expensive cell will be tolerated. In other words, a basic device cost penalty will be accepted under certain conditions. However, when space is a lesser factor, such as in ground based systems, a moderate area penalty is acceptable because the cost penalty is no longer justified.

One way of using an organic semiconductor in a solar cell structure is to make a Schottky-barrier junction with a plastic semiconductor. To this end, it is well known that organic semiconductors can be doped and used in conjunction with metal electrodes to produce Schottky-barrier solar cell structures. As described in C&E News on Apr. 24, 1981, for example, in an article on page 19 et. seq. entitled, "New Work Adds to Polyacetylene Potential," it is stated that doping of polyacetylene forms either an n-type or a p-type semiconductor. The article goes on to say that the electronic properties of doped polyacetylene are similar to those of classical semiconductors such as silicon. The article concludes by speculating that doped polyacetylene might be useful in solar cell applications where sunlight is converted directly into electricity.

The Aug. 27, 1979, issue of C&E News, page 8, contains another article that discusses the potential of doped polyacetylene as a highly conductive polymer. This article, which is entitled, "Polymer Complexes are Highly Conductive," concludes that Schottky-barrier photo cells are one application of polyacetylene that has been doped to an n-type or p-type semiconductor.

SUMMARY OF THE INVENTION

It has now been discovered that an improved Schottky-barrier junction photovoltaic cell structure can be made with an organic semiconductor active material by using undoped polyacetylene and a conductive electrode to form the Schottky-barrier junction within the body of the cell structure. Undoped polyacetylene is referred to hereinafter as $(CH)_x$ active material.

In a preferred embodiment, for example, the conductive electrode comprises a magnesium metal electrode which forms a rectifying contact on one side of the active material within the body of the cell structure. Advantageously, the $(CH)_x$ is a film having a thickness equal to or about the same as a depletion depth or an absorption length, whichever is less, and the band gap of the $(CH)_x$ is between about 1.5 and 2.0 eV; also, the difference in work functions between the magnesium and $(CH)_x$ is as large as possible. Still further, purely ohmic gold metal overlayer passivates the magnesium from reaction with air. With the proper selection of elements and locations, as described in more detail hereinafter, the desired Schottky-barrier junction photovoltaic cell structure is achieved. Thus, in one example, the magnesium forms a thin Schottky-barrier on a thin film of polyacetylene with a Schottky-barrier height of $\geq 0.6$ eV.

It is an object of this invention, therefore, to provide a photovoltaic cell structure and solar cell having an active medium including an undoped polyacetylene organic semiconductor that forms a Schottky-barrier junction with a conductive electrode.

It is another object to provide a solar cell having an undoped polyacetylene active material that forms a Schottky-barrier junction with a magnesium metal electrode.

It is a still further object to provide a photovoltaic cell structure and solar cell, comprising a magnesium metal electrode, an undoped, organic semiconductor active material comprising polyacetylene, that forms a Schottky-barrier junction in rectifying contact with the magnesium metal electrode, a gold overlayer in ohmic contact with the magnesium metal electrode, and a support for the cell structure.

The above and further novel features and objects of this invention will appear more fully from the following detailed description when the same is read in connection with the accompanying drawings. It is to be expressly understood, however, that the drawings are not intended as a definition of the invention but are for the purposes of illustration only.

BRIEF DESCRIPTION OF THE DRAWINGS

In the figures where like elements are referenced alike:

FIGS. 1a and 1b are partial cross sections through first and second embodiments of the photovoltaic cell structure and solar cell of this invention.

DESCRIPTION OF THE PREFERRED EMBODIMENT

Figures 2A, 2B:
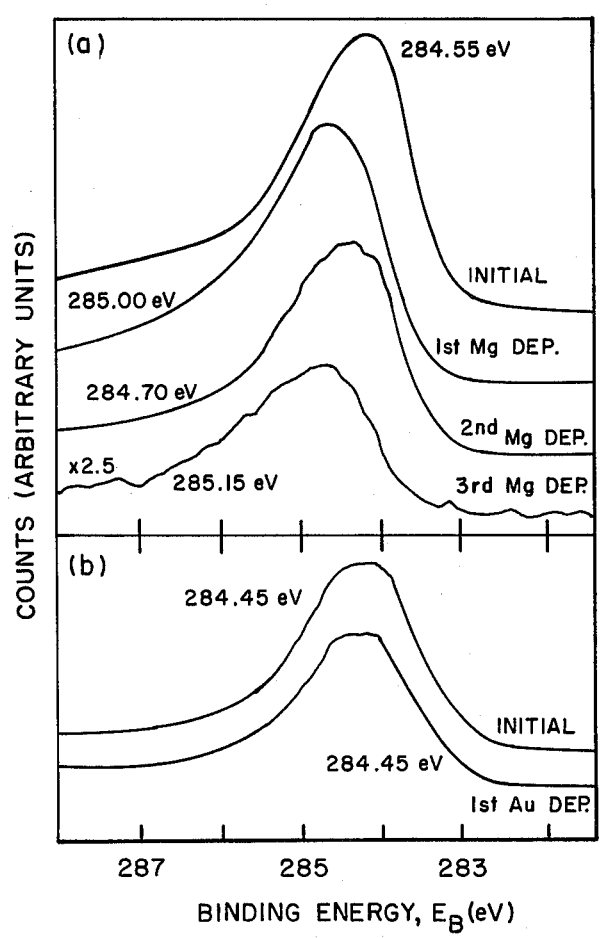
FIGS. 2a and 2b are graphic illustrations of the binding energy of the carbon 1s core-level in $(CH)_x$ after successive magnesium and gold depositions, respectively.

This invention is useful in providing a plastic Schottky-barrier junction, photovoltaic cell structure, and solar cell. As such, this invention is useful for converting sunlight directly into electricity. However, this invention can be used with a large variety of other light sources to produce electricity directly.

It is known that polyacetylene $(CH)_x$ is an active plastic material formed from the catalytic polymerization of acetylene gas, as reported in *Appl. Phys. Lett.*

Vol. 38, pg. 53, Jan. 1, 1981, by the inventor of this invention, which is incorporated by reference herein. Moreover, this active polyacetylene is a prototype polymeric semiconductor owing to its remarkable electrical and optical properties. The electrical conductivity of $(CH)_x$ films, for example, can be controlled from semi-insulating to metallic (more than 12 orders of magnitude change) by impurity doping. In an analogy to conventional inorganic semiconductors, both p- and n-type extrinsic conductivity have been identified by using junction I-V measurements. Although the exact nature of the conductivity mechanism is still unsettled, the possibility of using $(CH)_x$ in active electronic devices is appealing. To this end, experiments have been reported where active metallically doped $(CH)_x$ was used as a Schottky-barrier contact to Si and Ga As, as reported in *Appl. Phys. Lett.* Vol. 35. pg. 83 (1979) by M. Ozaki, D. L. Peebles, B. R. Weinberger, C. K. Chiang, S. C. Gau, A. J. Heeger and A. G. MacDiarmid, which is incorporated by reference herein. Also, in doped p-$(CH)_x$ Schottky-barriers have exhibited photo response to visible light, as reported in *Solid State Commun.* Vol. 33, pg. 499 (1980) by T. Tani, P. M. Grant, W. D. Gill, G. B. Strut and T. C. Clarke.

It has now been discovered that an improved Schottky-barrier junction photovoltaic cell structure can be fabricated having an inorganic semiconductor active material made from undoped polyacetylene with a band gap of between about 1.5 to 2.0 eV in rectifying contact with a magnesium metal conductive electrode of lower work function than the polyacetylene within the cell structure.

Advantageously, the undoped polyacetylene has a thickness of the order of a depletion depth, which in turn equals or nearly equals the absorption length. The active material forms a film about 1 micron thick. The $(CH)_x$ band gap of between 1.5 and 2.0 eV provides a good match to the solar spectrum.

The conductive electrode forms a rectifying contact 1-2 monolayers thick with a Schottky-barrier height of $\geq 0.6$ eV. Thus, the Mg has a work function that is low compared to the work function of the $(CH)_x$. As will be understood in more detail hereinafter, the preferred embodiment using magnesium has a Schottky-barrier height of $\sim 1$ eV to provide a desired match with the active material within the cell structure.

While not completely understood, it is believed that the mechanism for this Schottky-barrier junction formation in the body of the cell structure is the classic electrostatic work function difference between the metal and the semiconductor at the metal-polyacetylene interface. Also, it is believed that there are no intrinsic or extrinsic filled interface sites within the polyacetylene band gap.

In understanding how the work function differences form the desired Schottky-barrier junction, reference is made to FIGS. 1a and 1b, which are partial cross-sections of first and second preferred embodiments of the photovoltaic cell structure 13 of this invention. A film 15 about 1 micron thick of undoped, carbon-based, polymeric, intrinsically p-type polyacetylene $(CH)_x$ is applied to conducting support 17 in the embodiment of FIG. 1a by catalytic polymerization of acetylene gas in situ. Conventional x-ray photoemission spectroscopy (XPS) shows that a conductive electrode, e.g., an evaporated metal overlay forming a conductive electrode 19 of 1-2 monolayers of magnesium (Mg) that are $<30$Å thick and produces a directly observed change in band bending at the Mg-$(CH)_x$ interface. This interface 11 is characterized by creation of a rectifying contact that corresponds to a Schottky-barrier junction formation in a p-type semiconductor via a space-charge (carrier depletion) layer and an associated barrier region in the $(CH)_x$. The thickness of this layer is defined as the depletion depth. No change in $(CH)_x$ band bending by contact formation was observed at the interface between an Au overlay 21 up to 20Å thick deposited directly onto the $(CH)_x$ in a separate experiment in which probe electrical contacts and/or collecting grids 25 were applied to the Au overlayer 21. To form a solar cell, one of these contacts or collecting grids 25 is connected through a load 26 to the conducting support 17 in the embodiment of FIG. 1a.

The XPS data correlated well with I-V transport measurements subsequently made using the same metal-$(CH)_x$ interfaces characterized by XPS; that is, the Mg/$(CH)_x$ contact was rectifying, the Au/$(CH)_x$ contact was ohmic. The results indicated that the $(CH)_x$ energy bands were initially flat or minimally bent at a free surface and that Schottky-barrier junction formation within the body of the cell structure is most likely due to the electrostatics of work function differences at the metal-$(CH)_x$ interface region.

In XPS, monochromatic x-rays of energy hv incident on a sample cause photoelectrons to be ejected. These photoelectrons are energy analyzed and recorded on a binding energy $(E_B)$ scale, $E_B = hv - E_K$, referenced to the sample Fermi level, $E_F$, where $E_K$ is the photoelectron kinetic energy and $E_B = 0 \equiv E_F$. An XPS spectrum thus contains peaks at characteristic values of $E_B$ from the core-level energy bands of the elements which constitute the sample. For a semiconductor, the precise $E_B$ value for a given core-level peak depends, in an easily separable way, both on the chemical environment of the element ("chemical shift") and on the position of the Fermi level in the energy gap. The typical 20-30Å escape depth for photoelectrons restricts XPS analysis to a surface region of a sample which is, for semiconductors, a depth much less than typical band bending lengths (depletion widths). Thus by beginning with a "clean" (no metallic overlayer) $(CH)_x$ surface and successively depositing thin ($<30$Å) overlayers of Mg or Au, the binding energy value of a selected core level (particularly the C 1s level in $(CH)_x$) will reflect (a) any change of Fermi level position in the $(CH)_x$ band gap at the metal-$(CH)_x$ interface (band bending) and (b) interface chemistry occurring during contact formation.

The experimental apparatus used was a Hewlett-Packard 5950A XPS spectrometer combined with an ultra-high-vacuum sample preparation chamber. This chamber was equipped with a metal evaporator and a deposition monitor. The XPS x-ray source was Al $K_\alpha$ (hv = 1486.6 eV) radiation, and the system base pressure was $\sim 2 \times 10^{-10}$ Torr.

Thin-film, $\sim 1$ μm, $(CH)_x$ samples were prepared in a vacuum container by polymerizing $C_2H_2$ gas directly onto flat, Au covered metal plates equivalent to support 17 by using a Ziegler-Natta catalyst. The resulting $(CH)_x$ film was metallic gray in appearance and was composed of a matted mass of interwoven small diameter ($\sim 200$Å) fibrils of crystalline trans-$(CH)_x$. Some $(CH)_x$ films 15 were doped by exposure to pure iodine vapor for 60 sec at 0.2 Torr. Upon insertion into the XPS system, a survey spectrum was taken to chemically analyze each film. In addition, to C, each $(CH)_x$ film contained random, non-doped and small amounts of Al, Ti, F, and O due principally to random, residual, small amounts of the polymerizing catalyst (H is not detectable by XPS).

Since the $(CH)_x$ does not have a uniform smooth surface, but consists of an open network of fibrils, it is not possible to quantitatively define a thickness for a thin deposited metal film. However, the relative amount of a metal deposit can be judged by the attenuation of XPS peaks originating in the $(CH)_x$ substrate, which is what was done. For a uniform metal overlayer on an assumed smooth undoped $(CH)_x$ substrate, the intensity of the substrate peaks decreases exponentially, with a 25-Å overlayer to a 1/e reduction.

In the embodiment of FIG. 1b, the $(CH)_x$ is supported by a Mg overlayer(s) 19 and an Au overlayer 21, which in turn is supported by a transparent glass support 17'. To this end, the Au and Mg overlayers are applied to the support before the $(CH)_x$ film 15.

In practice, the embodiment of FIG. 1b employs probe electrical contacts and/or collecting grids 25, which are connected to the Mg overlayer(s) 19 through load 26.

FIG. 2a is a sequence of four C 1s core-level peaks taken during a succession of Mg depositions made onto a film of undoped $(CH)_x$. The initial peak, from "clean" (as prepared) $(CH)_x$ established a reference energy to measure relative surface potential changes. For example, after the first deposition of Mg, which reduced the initial intensity by ~5%, the C 1s peak was shifted 0.45 eV to higher energy. Peak energies were consistently measured at the center-of-peak width at half-height to a precision of 0.05 eV. The peak half-width was unchanged; this indicated no chemical effects occurred. Thus the $(CH)_x$ energy bands at the surface have shifted 0.45 eV downward from the Fermi level relative to their initial position. For a p-type semiconductor (as the $(CH)_x$ was shown to be) such a shift corresponded to a 0.45 eV increase in Schottky-barrier height and the formation of a space-charge (carrier free) region in the $(CH)_x$ adjacent to the metal interface. A second Mg deposition was made, which reduced the C 1s peak intensity by a total of 20% of initial, and the sample was left exposed to a system background atmosphere of ~$10^{-9}$ Torr pressure for 3 days. The C 1s peak now shifted to lower energy by 0.3 eV (0.15 eV higher than the initial energy), which corresponded to a 0.3-eV decrease in Schottky-barrier height as a result of this "aging" procedure. A third deposit of fresh Mg shifted the C 1s is peak 0.45 eV back to higher binding energy, for a total of 0.6 eV band bending form the initial no Mg energy. Thus the Mg Schottky-barrier height observed by XPS was a minimum of 0.6 eV on the undoped $(CH)_x$.

The effect of Au on undoped $(CH)_x$ band bending is shown in FIG. 2b. For a deposit of Au reducing the initial C 1s peak by 20% there was neither a change in the C 1s peak energy nor any line broadening. Thus Au had no electrical or chemical effect on undoped $(CH)_x$. If, then, the $(CH)_x$ bands have small or no band bending initially, this XPS data predicts Au to be an ohmic contact, in contrast to the rectifying Mg contact.

Figure 3:
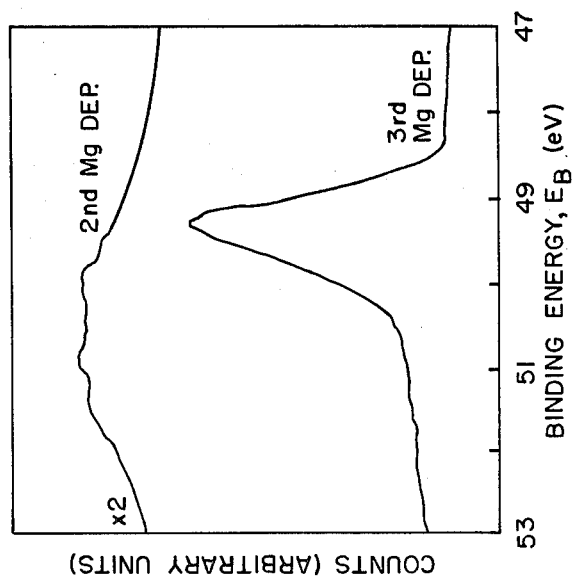
FIG. 3 is a graphic illustration of the binding energy core-level peaks from magnesium for a succession of metal depositions on $(CH)_x$.

The up-down-up cycling of Schottky-barrier height observed in FIG. 2a for Mg contacts can be explained by examining the corresponding Mg 2p core-level peak data. In FIG. 3 the upper Mg 2p peak, taken when the C 1s was at 284.70 eV (after the 3 day aging), was contrasted with the lower Mg 2p peak, taken when the C 1s peak was at 285.15 eV (after the final Mg deposition).

The lower Mg 2p peak was narrow, and at the energy position of metallic Mg, the upper Mg 2p peak was broadened and shifted by more than 1 eV to higher binding energy, which indicated oxidized, nonmetallic Mg. Thus it appeared that the Schottky-barrier arose solely from the metallic nature of the Mg; as the initial Mg deposits oxidized during the 3 day aging period the Schottky-barrier was lost, but was reformed by again depositing metallic Mg.

An I-doped $(CH)_x$ film exhibited the same band-bending behavior with Mg deposition as the undoped material. That is, Mg produced a 0.55 eV increase in band-bending, with coincident formation of a Schottky barrier and space charge depletion region.

Although the electrical behavior shown in the XPS data is similar for Mg independent of the I-doping, a pronounced chemical reaction occurred between Mg and I when Mg was deposited on the doped $(CH)_x$. Instead of the sharp narrow metallic Mg 2p core-level peak observed for fresh Mg on undoped $(CH)_x$, the Mg 2p peak on the doped film had a large shoulder on its higher binding energy edge, indicative of considerable Mg-I compound formation. In addition, the amount of I detected by XPS increased twofold in the presence of the Mg. Apparently, some I outdiffusion occurred as a consequence of the Mg-I reaction; however, the XPS data also showed that the Mg film remained predominantly metallic.

Upon completion of the XPS measurements, additional deposition of either Mg or Au was made onto the undoped $(CH)_x$ films to make a metallic layer thick enough to allow a probe electrical contact. Metal dots, 10-mils in diameter, which can be used to form contacts or contact-like collecting grids 25, were isolated on the film by photolithography and etching. These metal-dot contacts were then used for I-V measurements to correlate the transport properties of the contacts with the XPS interface data.

Figure 4:
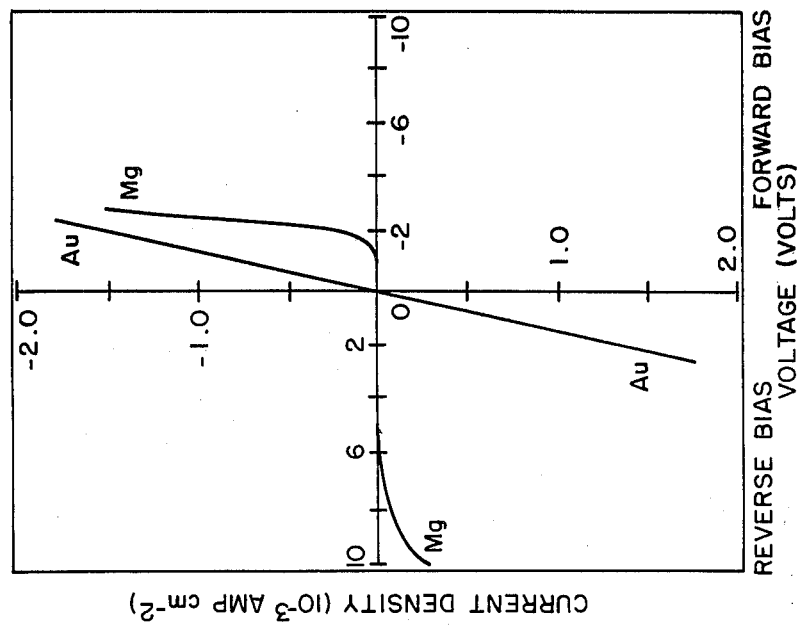
FIG. 4 is a graphic illustration of I-V data for Mg and Au metal contacts for $(CH)_x$ corresponding to the interfaces characterized by XPS.

FIG. 4 shows representative I-V data for both the Mg and the Au contacts to the undoped $(CH)_x$. The Au contact exhibited obvious pure ohmic behavior, consistent with the XPS data. There was a rather large series resistance, ~$10^3$ $\Omega$ cm$^2$, evidently owing to the low conductivity of undoped $(CH)_x$. The Mg contact, in comparison, showed a remarkably good rectifying characteristic, with a rectification ratio of ~1000 at ±2.5V, consistent with Schottky-barrier formation. The polarity (forward bias was negative voltage applied to the metal) of the I-V data confirmed that the undoped $(CH)_x$ material was p-type.

The ohmic nature of the Au contact I-V data coupled with the XPS data led to the conclusion of no or minimal band-bending (i.e., flat band) for the free surface of $(CH)_x$ and for p-type $(CH)_x$ in contact with high-work-function metals. These data also suggest the absence of $(CH)_x$ interface states. The rectifying nature of the Mg contact I-V data coupled with the downward 0.6 eV movement of the $(CH)_x$ bands observed by XPS upon Mg deposition was evidence that the $(CH)_x$ Schottky-barrier junction arose from the low work function of Mg with respect to the work function of the $(CH)_x$ and was $\geq 0.6$ eV in magnitude. It was thus concluded that the mechanism of Schottky-barrier formation of $(CH)_x$ was the classic electrostatic model in which the barrier arose from the work function difference between the metal and the semiconductor.

In the embodiments shown in FIGS. 1a and 1b, the probe electrical contacts and/or collecting grids 25, the gold overlayers 21, the magnesium overlayers 19, and the polyacetylene films 15 were applied by conventional means and methods well known in the art from the above-referenced publications, which are incorporated by reference herein.

In operation, the gold overlayer passivates the magnesium overlayer. Also, the cell structures 13 form solar cells having either transparent overlayers 19 and 21 and a conducting support 17, or a transparent glass support 17' through which sunlight reaches the active material of film 15. Thereupon, an electrical current flows between metal collecting grids 25 and the conducting support 17 or the Mg overlayer(s) 19 respectively, as understood from the embodiments of FIGS. 1a and 1b when read in connection with the above descriptive material.

This invention has the advantage of providing a photovoltaic cell structure that is fabricated from undoped polyacetylene that forms a rectifying Schottky-barrier junction with a magnesium overlayer. A gold ohmic contact passivates the magnesium. Thus, this invention provides an inexpensive, effective and relatively efficient solar cell.

What is claimed is:

1. A Schottky barrier junction photovoltaic cell comprising an organic semiconductor active material in rectifying contact with a conductive electrode, wherein said organic material is comprised of undoped polyacetylene having a thickness of the order of a depletion depth; and wherein said conductive electrode is comprised of a thin layer of magnesium, said magnesium layer forming a Schottky barrier junction with said polyacetylene, and a thin layer of gold on said magnesium layer.

2. The cell of claim 1 wherein said magnesium layer has a thickness of the order of 1-2 monolayers.

3. The cell of claim 1 wherein said polyacetylene layer has a thickness of the order of 1 $\mu$m.

4. The cell of claim 1 further comprising a support.

5. The cell of claim 4 wherein said support covers said gold layer.

6. The cell of claim 4 wherein said support is conductive and is covered by said polyacetylene layer.

* * * * *